(12) United States Patent
Kubo et al.

(10) Patent No.: US 11,929,303 B2
(45) Date of Patent: Mar. 12, 2024

(54) SEMICONDUCTOR DEVICE AND METHOD OF PRODUCING THE SAME

(71) Applicant: Dexerials Corporation, Tokyo (JP)

(72) Inventors: Yusuke Kubo, Tokyo (JP); Sergey Bolotov, Tokyo (JP)

(73) Assignee: Dexerials Corporation, Tokyo (JP)

( * ) Notice: Subject to any disclaimer, the term of this patent is extended or adjusted under 35 U.S.C. 154(b) by 637 days.

(21) Appl. No.: 16/973,035

(22) PCT Filed: Jun. 19, 2019

(86) PCT No.: PCT/JP2019/024366
§ 371 (c)(1),
(2) Date: Dec. 8, 2020

(87) PCT Pub. No.: WO2019/244953
PCT Pub. Date: Dec. 26, 2019

(65) Prior Publication Data
US 2021/0272879 A1    Sep. 2, 2021

(30) Foreign Application Priority Data

Jun. 21, 2018 (JP) .................. 2018-118082

(51) Int. Cl.
*H01L 21/56* (2006.01)
*H01L 23/367* (2006.01)
(Continued)

(52) U.S. Cl.
CPC .......... *H01L 23/4334* (2013.01); *H01L 21/56* (2013.01); *H01L 23/367* (2013.01); *H01L 23/3733* (2013.01)

(58) Field of Classification Search
None
See application file for complete search history.

(56) References Cited

U.S. PATENT DOCUMENTS

| 2001/0009302 A1* | 7/2001 | Murayama .......... H01L 23/3733 257/706 |
| 2015/0163958 A1* | 6/2015 | Oguma .................. C08L 33/00 524/556 |
| 2018/0269126 A1* | 9/2018 | Im ......................... H01L 25/105 |

FOREIGN PATENT DOCUMENTS

| JP | H11317592 A | 11/1999 |
| JP | 2001176995 A | 6/2001 |

(Continued)

OTHER PUBLICATIONS

Dec. 20, 2022, Notification of Reasons for Refusal issued by the Japan Patent Office in the corresponding Japanese Patent Application No. 2018-118082.

(Continued)

*Primary Examiner* — Cory W Eskridge
(74) *Attorney, Agent, or Firm* — KENJA IP LAW PC

(57) ABSTRACT

Provided is a semiconductor device having excellent heat dissipation capacity and electromagnetic wave suppression effect. A semiconductor device 1 includes a semiconductor element 30; a conductive cooling member 40 provided above the semiconductor element 30, a conductive thermally conductive member 10 that is provided between the semiconductor element 30 and the cooling member 40 and contains a cured resin. The conductive thermally conductive member 10 is connected to a ground 60 in the substrate 50 to electrically connect the cooling member 40 and the ground 60.

11 Claims, 7 Drawing Sheets

(51) Int. Cl.
    *H01L 23/373*    (2006.01)
    *H01L 23/433*    (2006.01)

(56)            References Cited

FOREIGN PATENT DOCUMENTS

| JP | 2002026178 A | 1/2002 |
| JP | 2008166641 A | 7/2008 |
| JP | 2012164852 A | 8/2012 |
| JP | 2017038086 A | 2/2017 |
| JP | 2017057246 A | 3/2017 |
| JP | 2018073897 A | 5/2018 |
| WO | 2013035819 A1 | 3/2013 |
| WO | 2016190258 A1 | 12/2016 |

OTHER PUBLICATIONS

Sep. 10, 2019, International Search Report issued in the International Patent Application No. PCT/JP2019/024366.
Dec. 24, 2020, International Preliminary Report on Patentability issued in the International Patent Application No. PCT/JP2019/024366.
Jun. 21, 2022, Notification of Reasons for Refusal issued by the Japan Patent Office in the corresponding Japanese Patent Application No. 2018-118082.
Jan. 24, 2022, Office Action issued by the Korean Intellectual Property Office in the corresponding Korean Patent Application No. 10-2020-7036261.

* cited by examiner

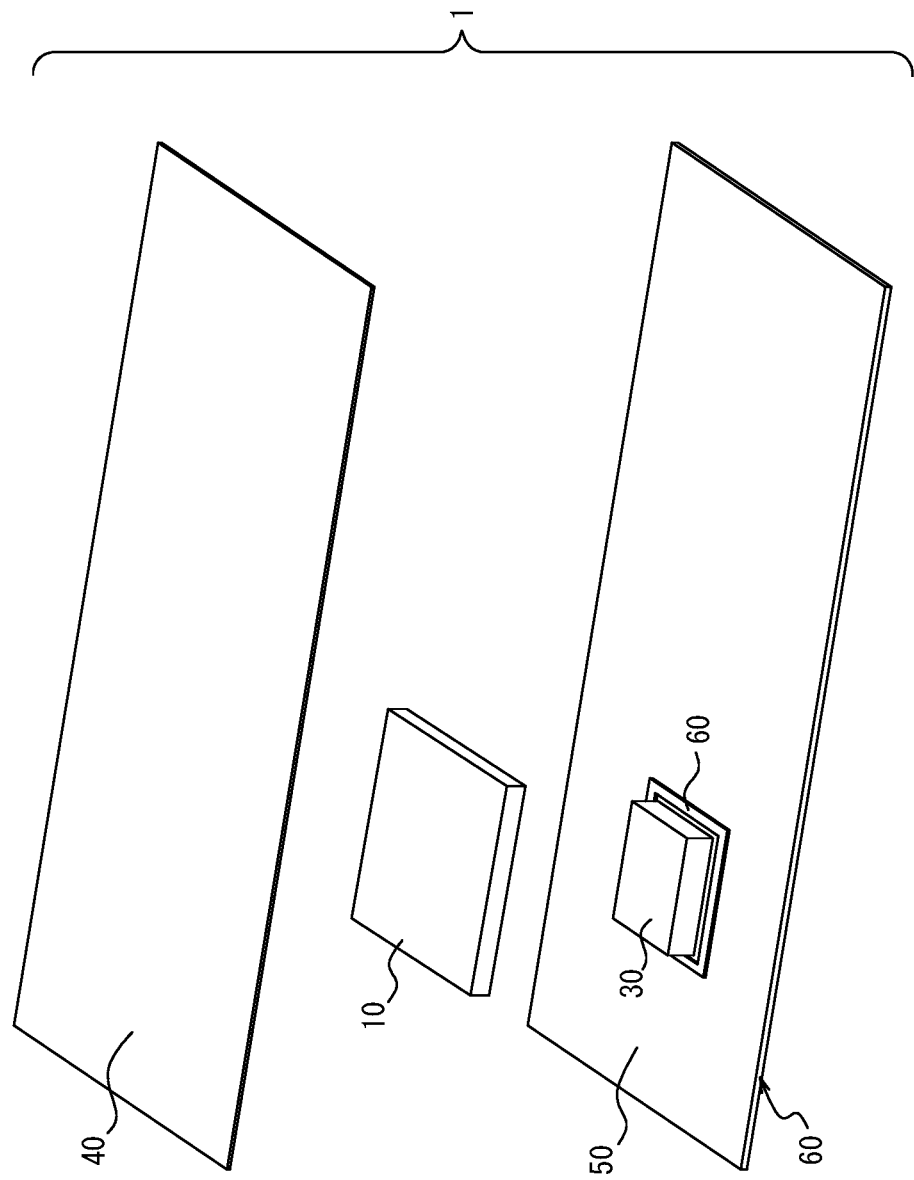

SEMICONDUCTOR DEVICE AND METHOD OF PRODUCING THE SAME

TECHNICAL FIELD

The present disclosure relates to a semiconductor device that has excellent heat dissipation capacity and electromagnetic wave suppression effect and can be produced easily at low cost, and a method of producing the semiconductor device.

BACKGROUND

Recent years have seen size reductions of electronic devices. Meanwhile, because power consumption cannot be significantly changed in order to cover a variety of applications, heat dissipation measures for the devices have become more important.

As heat dissipation measures for electronic devices, for example, radiator plates, heat pipes, and heatsinks made of a metallic material having high thermal conductivity such as copper or aluminum are widely used. Such a heat dissipating component with excellent thermal conductivity is located near an electronic component, such as a semiconductor package, which is a heat generating portion in an electronic device in order to dissipate heat or to reduce temperature variations in the device. The heat dissipating component with excellent thermal conductivity is also placed to extend from the electronic component which is a heat generating portions to a low-temperature area.

Note that the heat generating portion in the electronic device is an electronic component such as a semiconductor element with high current density, and high current density is considered to indicate that the strength of an electric field or a magnetic field which can cause an unwanted radiation component is likely to be high. Accordingly, if the heat dissipating component made of metal is placed near in the proximity of an electronic component, the heat dissipating component would not only absorb heat, but also would pick up harmonic components of an electric signal passing through the electronic component. Specifically, since the heat dissipating component is made of a metallic material, the above problem is found when the heat dissipating component acts as an antenna for the harmonic components or acts as a transmission path for the harmonic noise components.

The development of techniques to achieve both heat dissipation capacity and electromagnetic wave suppression effect is therefore desirable.

For example, JP 2012-164852 A (PTL 1) discloses a technique of providing, in a shield member having a large opening, a semiconductor package with a lid attached thereto and an annular lid contact portion in electrical contact with the upper peripheral edge of the lid, and electrically connecting the lid contact portion and the shield member.

The technique described in PTL 1 produces certain levels of heat dissipation capacity and electromagnetic wave suppression effect. However, it is considered in the case where a substrate or a cooling member is large, electromagnetic resonance occurs, and sufficient electromagnetic wave suppression effect cannot be achieved. Moreover, further improvement in heat dissipation capacity has been desired.

Further, in recent years, there are increasing demands for reduction in production cost and improvement in the ease of production, and the development of semiconductor devices that can satisfy these demands has been desired.

CITATION LIST

Patent Literature

PTL 1: JP 2012-164852 A

SUMMARY

Technical Problem

It could therefore be helpful to provide a semiconductor device that can be produced easily at low cost and has excellent heat dissipation capacity and electromagnetic wave suppression effect.

Solution to Problem

Through extensive studies for addressing the above challenges, we found that heat exchange can be effectively performed between a semiconductor element and a conductive cooling member by forming a conductive thermally conductive member between the semiconductor element and the cooling member, and the heat dissipation capacity can be enhanced. Also found was that when the conductive thermally conductive member provided between the semiconductor element and the cooling member is connected to a ground in a substrate, the cooling member and the ground are electrically connected, so that an electrically closed space can be formed in the semiconductor device. We thus found that the electromagnetic wave suppression effect can also be significantly improved without providing an electromagnetic shielding member such as a shield can. In addition, in the present disclosure, it was found that a cured resin is contained in the conductive thermally conductive member so that the conductive thermally conductive member is made to have flexibility, thus it can be deformed into a variety of shapes, which provides ease of production and reduction in the production cost.

Hence, a semiconductor device according to the present disclosure can provide both heat dissipation capacity and electromagnetic wave suppression effect at higher levels than conventional techniques. Moreover, since a conductive shield member such as a conductive shield can is not provided in the semiconductor device according to the present disclosure, the semiconductor device can be made thinner, and produced more easily at lower cost.

The present disclosure is based on the above findings. We herein propose the following features.

(1) A semiconductor device comprising: a semiconductor element provided on a substrate; a conductive cooling member provided above the semiconductor element; and a conductive thermally conductive member containing a cured resin, the conductive thermally conductive member being provided between the semiconductor element and the cooling member, wherein the conductive thermally conductive member is connected to a ground in the substrate to electrically connect the cooling member and the ground.

With such a structure, excellent heat radiation capacity and electromagnetic wave suppression effect can be achieved.

(2) The semiconductor device according to (1) above, wherein the conductive thermally conductive member is provided to cover the semiconductor element and abuts at least part of an upper surface and a side surface of the semiconductor element.

(3) The semiconductor device according to (1) above, wherein the conductive thermally conductive member seals the upper surface and the side surface of the semiconductor element.

(4) The semiconductor device according to any one of (1) to (3) above, wherein a resistivity of the conductive thermally conductive member is 0.15 Ω·m or less.

(5) The semiconductor device according to any one of (1) to (4) above, wherein a resistivity of the conductive thermally conductive member is 0.00001 Ω·m or more.

(6) The semiconductor device according to any one of (1) to (5) above, wherein the conductive thermally conductive member has magnetic properties.

(7) The semiconductor device according to any one of (1) to (6) above, wherein the conductive thermally conductive member has tackiness or adhesiveness at a surface thereof.

(8) The semiconductor device according to any one of (1) to (7) above, wherein the conductive thermally conductive member has flexibility.

(9) The semiconductor device according to any one of (1) to (8) above, wherein the conductive thermally conductive member contains a conductive filler.

(10) The semiconductor device according to (9) above, wherein the conductive filler is carbon fiber.

(11) The semiconductor device according to any one of (1) to (9) above, part of the substrate other than the ground is insulated.

(12) A method of producing the semiconductor device according to any one of (1) to (11) above, the method comprising:

a step of fixing by pressure a sheet-like conductive thermally conductive member containing a cured resin onto a semiconductor element, thereby joining the semiconductor element and the conductive thermally conductive member and joining the conductive thermally conductive member and a ground.

With the above features, a semiconductor device having excellent heat dissipation capacity and electromagnetic wave suppression effect can be produced easily at low cost.

Advantageous Effect

It is thus possible to provide a semiconductor device that can be produced easily at low cost and has excellent heat dissipation capacity and electromagnetic wave suppression effect.

BRIEF DESCRIPTION OF THE DRAWINGS

In the accompanying drawings:

FIG. 4 is a perspective view schematically illustrating the assembly of a semiconductor device according to one embodiment of the present disclosure;

FIG. 5A is a top view of the model of a semiconductor device, and FIG. 5B is a bottom view of the model of the model of a semiconductor device;

DETAILED DESCRIPTION

Embodiments of the present disclosure will now be described in detail with reference to the drawings.

Figure 1:
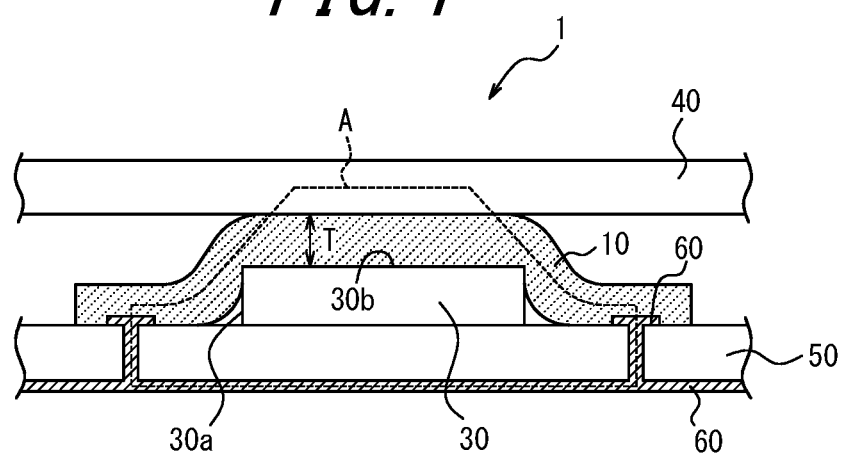
FIG. 1 is a diagram schematically illustrating a cross section of a semiconductor device according to one embodiment of the present disclosure.
Figure 2:
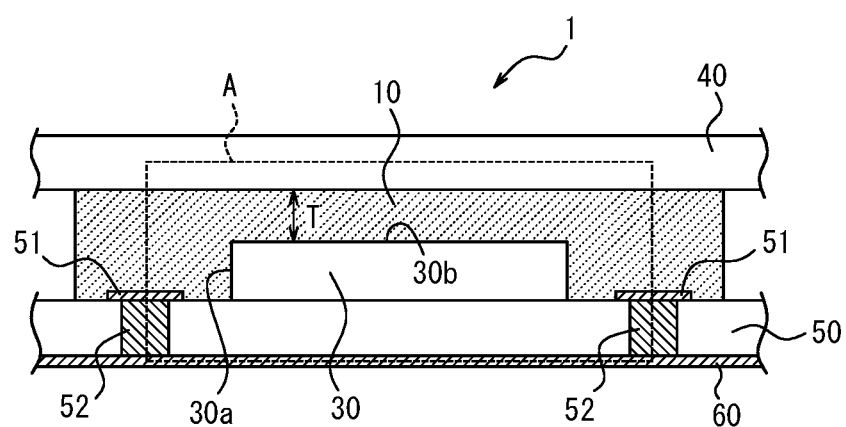
FIG. 2 is a diagram schematically illustrating a cross section of a semiconductor device according to another embodiment of the present disclosure.
Figure 3:
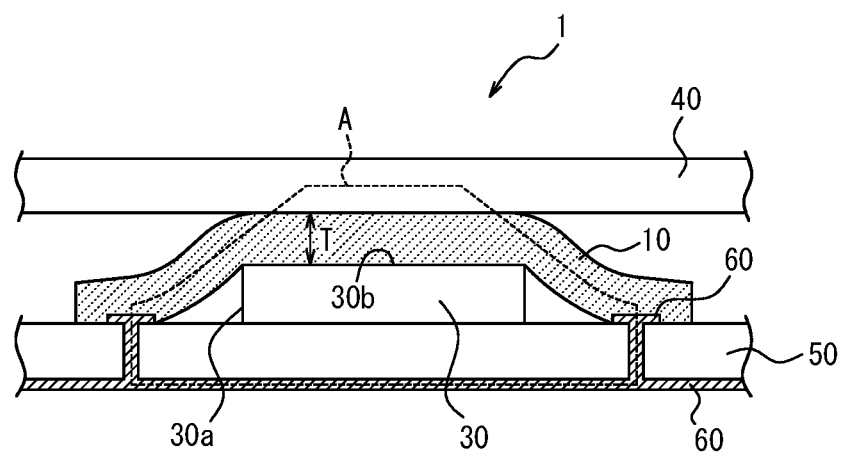
FIG. 3 is a diagram schematically illustrating a cross section of a semiconductor device according to another embodiment of the present disclosure.

Here, FIGS. 1 to 3 are diagrams each schematically illustrating a cross section of a semiconductor device according to one embodiment of the present disclosure. FIG. 4 is a perspective view illustrating the assembly of a semiconductor device according to one embodiment of the present disclosure. In each drawing, the shape and scale of each member are different from the actual shape and scale, for convenience of description. The shape and scale of each member may be changed as appropriate for each semiconductor device, unless otherwise specified herein.

<Semiconductor Device>

As illustrated in FIGS. 1 to 3, a semiconductor device 1 according to the present disclosure includes a semiconductor element 30, a conductive cooling member 40 provided above the semiconductor element 30, a conductive thermally conductive member 10 that is provided between the semiconductor device 30 and the cooling member 40 and contains a cured resin.

In the semiconductor device 1 according to the present disclosure, the conductive thermally conductive member 10 is connected to a ground 60 in the substrate 50 to electrically connect the cooling member 40 and the ground 60 as illustrated in FIGS. 1 to 3.

The semiconductor element 30 is a source of heat and electromagnetic waves; however, providing an electrically conductive sheet member having high thermal conductivity (conductive thermally conductive member 10) between the semiconductor element 30 and the cooling member 40 improves thermal conduction to the cooling member 40 and thus provides excellent heat dissipation capacity.

Further, in the semiconductor device 1 of the present disclosure, the conductive thermally conductive member contains a cured resin and is electrically connected to the ground 60 in the substrate 50 as illustrated in FIGS. 1 to 3, so that cooling member 40 and the ground 60 are electrically connected with the conductive thermally conductive member 10 therebetween. Thus, an electrically closed space (a space enclosed by broken lines in FIGS. 1 to 3) is formed in the semiconductor device 1 according to the present disclosure. This results in increased electromagnetic shielding effect and excellent electromagnetic wave suppression effect.

Moreover, since an electromagnetic shielding member such as a shield can is not separately formed in the semiconductor device 1 according to the present disclosure, the production cost can be reduced and the ease of production can be improved as compared with the conventional technique using an electromagnetic shielding member.

Figure 8A:
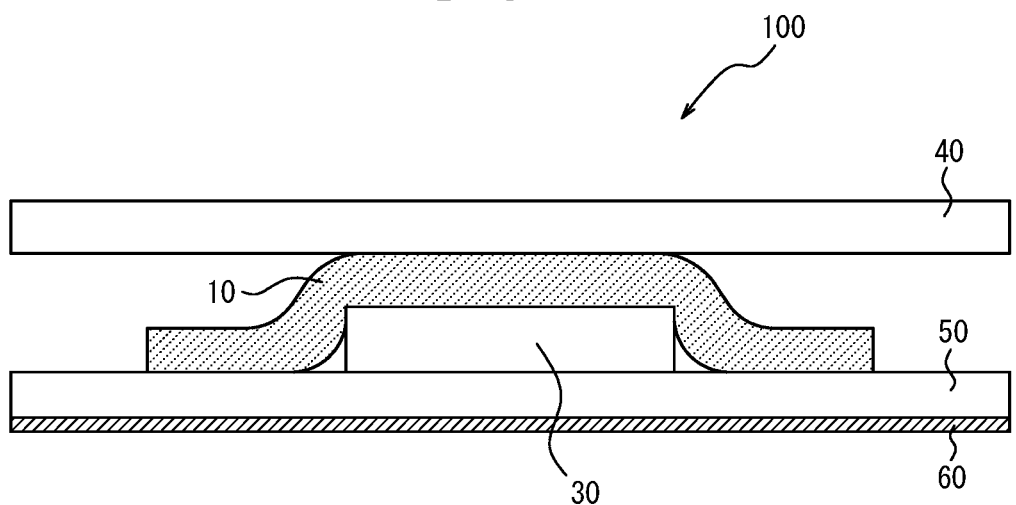
FIG. 8A is a diagram schematically illustrating a conventional semiconductor device according to one embodiment.
Figure 8B:
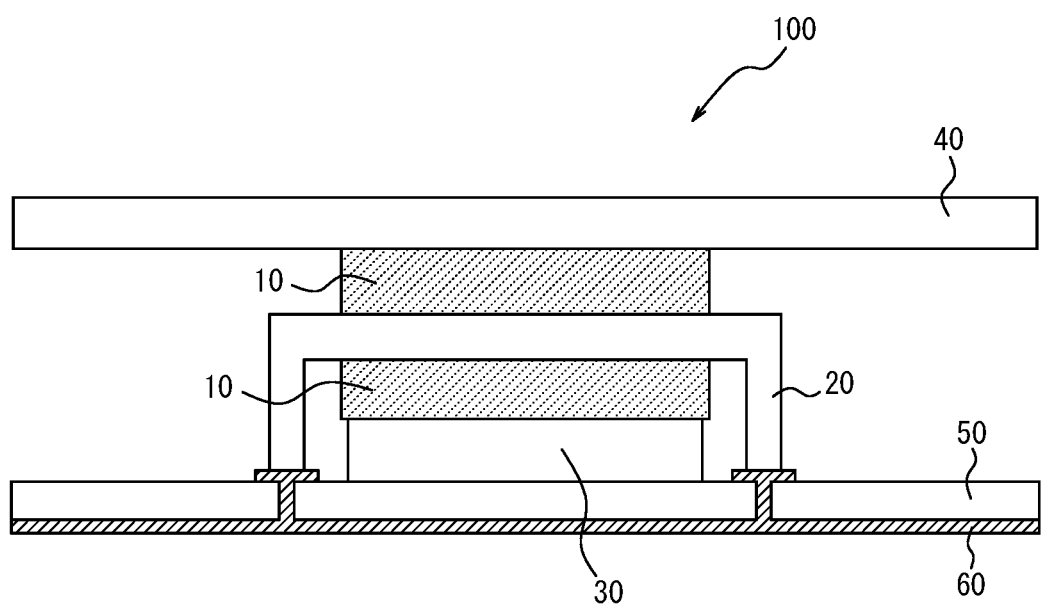
FIG. 8B is a diagram schematically illustrating a conventional semiconductor device according to another embodiment.

FIGS. 8A and 8B each illustrate an example of a semiconductor devices according to a conventional technique. In a semiconductor device 100 depicted in FIG. 8A, the conductive thermally conductive member 10 is provided to cover a semiconductor element 30, thus high heat dissipation effect can be obtained. However, since there is no connection between the conductive thermally conductive member 10 and the ground 60, an electrically closed space cannot be formed in the semiconductor device 100, thus sufficient electromagnetic wave suppression effect cannot be obtained.

Further, since the semiconductor device 100 depicted in FIG. 8B has a structure in which the conductive thermally conductive member 10 is stacked with a shield can 20 thereunder, the thermal resistance between the semiconductor element 30 and the cooling member 40 is high as compared with the semiconductor device 1 according to the present disclosure, thus sufficient thermal dissipation capacity cannot be obtained.

Each member included in the semiconductor device according to the present disclosure will now be described below.

(Semiconductor Element)

The semiconductor device 1 according to the present disclosure includes the semiconductor element 30 provided on a substrate 50, as illustrated in FIGS. 1 to 3.

The semiconductor element is not limited, as long as it is an electronic component using a semiconductor. Examples include integrated circuits such as ICs and LSIs, CPUs, MPUs, graphic processing units, and image sensors.

The substrate 50 on which the semiconductor element 30 is formed is not limited except that it is provided with the ground (GND) 60, and a suitable substrate may be used depending on the type of the semiconductor device. The ground 60 is formed on the back of the substrate 50.

In FIGS. 1 and 2, the conductive thermally conductive member 10 is directly connected to the ground 60 exposed in the substrate 50. On the other hand, in the semiconductor device 1 according to the present disclosure, for example, a land 51 can be provided on the surface of the substrate 50 so as to wholly or partially surround the semiconductor element 30, as illustrated in FIG. 3. This land 51 and the conductive thermally conductive member 10 are connected, so that the conductive thermally conductive member 10 can be electrically connected to the ground 60. The land 51 is electrically connected to the ground 60 via a conductively-treated through hole 52 formed in the substrate 50. Thus, the conductive thermally conductive member 10 can be electrically joined to the ground 60.

Further, part of the substrate 50 other than the ground 60 is preferably insulated. If the conductive thermally conductive member 10 touches other components, a short circuit occurs, causing a failure. In order to protect other components, the conductive thermally conductive member 10 except for the part connected to the ground 60 is desired to be insulated. Accordingly, when the substrate 50 is provided with the land 51 and a through hole 52, these parts are not insulated and need to be conductive.

(Cooling Member)

The semiconductor device 1 according to the present disclosure includes the conductive cooling member 40 provided above the semiconductor element 30 as illustrated in FIGS. 1 to 3.

The cooling member 40 is a member that absorbs heat generated from the heat source (semiconductor element 30) and dissipates it to the outside. Being connected to the semiconductor element 30 via the conductive thermally conductive member 10 to be described, the cooling member 40 can diffuse heat generated by the semiconductor element 30 to the outside, thus ensuring high heat dissipation capacity of the semiconductor device.

Since the cooling member 40 has electrical conductivity, when the cooling member 40 is electrically connected to the ground 60 via the conductive thermally conductive member 10 to be described, an electrically closed space (region A enclosed by the dashed lines in FIGS. 1 to 3) is formed, thus enhancing the electromagnetic wave suppression effect of the semiconductor device 1.

The type of the conductive cooling member 40 is not limited, and may be determined as appropriate depending on the type of the semiconductor device 1 according to the present disclosure. Examples include a radiator, a cooler, a heatsink, a heat spreader, a die pad, a cooling fan, a heat pipe, a metallic cover, and a cabinet. Of these conductive cooling members, a conductive radiator, cooler, or heatsink is preferred because higher heat dissipation capacity can be achieved. Further, the material forming the conductive cooling member 40 preferably includes a metal such as aluminum, copper, and stainless steel and graphite, in terms of enhancing thermal conductivity.

(Conductive Thermally Conductive Member)

As illustrated in FIGS. 1 to 3, the semiconductor device 1 according to the present disclosure includes the conductive thermally conductive member 10 that contains a cured resin and is provided between the semiconductor element 30 and the conductive cooling member 40, and in the semiconductor device, the conductive thermally conductive member 10 is connected to the ground 60 in the substrate 50, and the cooling member 40 and the ground 60 are electrically connected with the conductive thermally conductive member 10 therebetween.

When the conductive thermally conductive member 10 having high thermal conductivity is provided between the semiconductor element 30 and the cooling member 40, heat dissipation capacity can also be improved without reducing the electromagnetic wave suppression effect. In addition, when the cooling member 40 and the ground 60 are electrically connected via the conductive thermally conductive member 10, an electrically closed space A is formed in the semiconductor device 1 according to the present disclosure as illustrated in FIGS. 1 to 3, resulting in enhanced electromagnetic shielding effect. Thus, excellent electromagnetic wave suppression effect can be achieved.

The shape of the conductive thermally conductive member 10 is not limited, and may be changed as appropriate depending on, for example, the size and shape of the semiconductor element 30 or the design of the semiconductor device 1.

Specifically, as illustrated in FIG. 1 and FIG. 3, the conductive thermally conductive member 10 may be provided being shaped like a bent sheet between the semiconductor member 30 and the cooling member 40. Since the conductive thermally conductive member 10 contains a cured resin and is flexible to some extent, the conductive thermally conductive member 10 may have the shape depicted in FIG. 1 and FIG. 3 without going through complicated steps. Further, as illustrated in FIG. 2, the conductive thermally conductive member 10 may be provided to wholly enclose the semiconductor element 30 (to seal an upper surface 30b and a side surface 30a of the semiconductor element 30).

In terms of achieving more excellent electromagnetic wave suppression effect, it is preferred that the conductive thermally conductive member 10 is provided to cover the semiconductor device 30 and abuts at least part of the upper surface 30b and the side surface 30a of the semiconductor device 30 as illustrated in FIG. 1 and FIG. 3. This efficiently ensures electrical connection between the cooling member 40 and the ground 60, thus an electrically closed space A can be formed more reliably.

Further, in the same terms, the conductive thermally conductive member 10 preferably seals the upper surface 30b and the side surface 30a of the semiconductor element 30 as illustrated in FIG. 2.

The conductive thermally conductive member 10 may be a single layer sheet, or may be made up of a plurality of sheets.

For example, in the case where the conductive thermally conductive member 10 is provided being shaped like a bent sheet as illustrated in FIG. 1 and FIG. 3, the conductive thermally conductive member 10 may be a single layer sheet. Alternatively, the conductive thermally conductive member 10 may be made up of a plurality of sheets, for example to facilitate the adjustment of the sheet thickness.

Further, as illustrated in FIG. 2, when the conductive thermally conductive member 10 seals the upper surface 30b and the side surface 30a of the semiconductor element 30, a single sheet of the conductive thermally conductive member 10 may be processed. Alternatively, the conductive thermally conductive member 10 may be formed by combining a plurality of the conductive thermally conductive members 10.

The thickness T of the conductive thermally conductive member 10 is not limited, and may be changed as appropriate depending on the distance between the semiconductor element 30 and the cooling member 40, the design of the semiconductor device 1, and the like. In terms of achieving heat dissipation capacity and electromagnetic wave suppression effect at higher levels, the thickness T of the conductive thermally conductive member 10 is preferably 50 μm to 4 mm, more preferably 100 μm to 4 mm, and particularly preferably 200 μm to 3 mm. If the thickness T of the conductive thermally conductive member 10 is more than 4 mm, the distance between the semiconductor element 30 and the cooling member 40 is long, which is likely to cause a decrease in thermal conduction. If the thickness T of the conductive thermally conductive member 10 is less than 50 μm, the electromagnetic wave suppression effect is likely to be small.

Here, the thickness T of the conductive thermally conductive member 10 refers to the thickness T of the thickest part of the conductive thermally conductive member 10 on the semiconductor element 30 as illustrated in FIGS. 1 to 3, regardless of whether the conductive thermally conductive member 10 is formed from a single sheet or a plurality of sheets.

The conductive thermally conductive member 10 is required to contain a cured resin. Containing a cured resin, the conductive thermally conductive member 10 can have flexibility to some extent, which increases the ease of production.

The higher the flexibility of the conductive thermally conductive member 10 is, the more preferable; specifically, the rubber Shore 00 hardness (ASTM D2240) thereof is preferably in a range of 10 to 80.

The conductive thermally conductive member 10 preferably has high conductivity in terms of achieving excellent electromagnetic wave suppression effect.

Specifically, the resistivity of the conductive thermally conductive member 10 is preferably 0.15 Ω·m or less, more preferably 0.01 Ω·m or less, still more preferably 0.005 Ω·m or less, and particularly preferably 0.001 Ω·m or less. When the resistivity of the conductive thermally conductive member 10 is 0.15 Ω·m or less, more excellent electromagnetic wave suppression effect can be obtained.

Further, the resistivity of the conductive thermally conductive member 10 is preferably 0.00001 Ω·m or more. The electromagnetic wave suppression effect is large as the resistivity is low, that is, the conductivity is high, which increases the electromagnetic wave suppression effect.

The method of adjusting the conductivity (resistivity) of the conductive thermally conductive member 10 is not limited; for example, the adjustment may be performed by changing the type of a binder resin; the material, the amount added, and the orientation of a filler; etc.

Further, the thermal conductivity of the conductive thermally conductive member 10 is preferably 5 W/mK or more, more preferably 10 W/mK or more, and particularly preferably 20 W/mK or more. This can further increase the efficiency of the heat exchange between the semiconductor element 30 and the cooling member 40, which further can improve the heat dissipation capacity.

In addition, the conductive thermally conductive member 10 preferably has magnetic properties. This can impart electromagnetic wave absorption properties to the conductive thermally conductive member 10, thus more excellent electromagnetic wave suppression effect can be obtained.

Here, the method of adjusting the magnetic properties of the conductive thermally conductive member 10 is not limited; the adjustment can be performed for example by changing the amount of magnetic powder or the like contained in the conductive thermally conductive member 10.

In addition, the conductive thermally conductive member 10 preferably has tackiness or adhesiveness at its surface. This improves the adhesion between the conductive thermally conductive member 10 and other components. In the case where the conductive thermally conductive member 10 is made up of a plurality of sheets, the adhesion between the sheets can also be improved.

The method of imparting tackiness to the surface of the conductive thermally conductive member 10 is not limited. For example, tackiness may be imparted by optimizing the binder resin described below forming the conductive thermally conductive member 10. Alternatively, an adhesion layer having tackiness may be provided on the surface of the conductive thermally conductive member 10.

The material forming the conductive thermally conductive member 10 is not limited, as long as it provides excellent electromagnetic wave absorption performance and thermal conductivity.

For example, in terms of achieving high electromagnetic wave absorption properties and thermal conductivity, the conductive thermally conductive member may contain a binder resin, a thermally conductive filler, and other components.

Materials forming the conductive thermally conductive member 10 will be described below.

Binder Resin

A binder resin forming the conductive thermally conductive member refers to a cured product of a resin component that is a base material of the conductive thermally conductive member. The type of the binder resin is not limited, and a known binder resin may be selected as appropriate. An example of the binder resin is thermosetting resin.

Examples of the thermosetting resin include cross-linkable rubber, epoxy resin, polyimide resin, bismaleimide resin, benzocyclobutene resin, phenol resin, unsaturated polyester, diallyl phthalate resin, silicone, polyurethane, polyimide silicone, thermosetting polyphenylene ether, and thermosetting modified polyphenylene ether. These may be used alone or in combination of two or more.

Examples of the cross-linkable rubber include natural rubber, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, fluororubber, urethane rubber, acrylic rubber, polyisobutylene rubber, and silicone rubber. These may be used alone or in combination of two or more.

Of the above thermosetting resins, silicone is preferably used in terms of excellent formability and weather resistance and also in terms of adhesion and followability to the electronic component. The silicone is not limited, and the type of the silicone may be selected as appropriate depending on the purpose.

In terms of formability, weather resistance, adhesion, etc., silicone containing a liquid silicone gel as a base compound and a hardener is preferred. Examples of such a silicone include addition-reaction liquid silicone, high-temperature vulcanization millable type silicone using a peroxide for vulcanization, etc.

As the addition-reaction liquid silicone, for example, two-part addition-reaction type silicone containing, as the base compound, polyorganosiloxane having a vinyl group and, as the hardener, polyorganosiloxane having a Si—H group is preferred.

In the combination of the base compound of the liquid silicone gel and the hardener, the compounding ratio of the base compound and the hardener (base compound:hardener) is preferably 35:65 to 65:35 in mass ratio.

The content of the binder resin in the conductive thermally conductive member is not limited, and may be selected as appropriate depending on the purpose. For example, in terms of ensuring the formability of the sheet and the adhesion of the sheet, the content of the binder resin is preferably approximately 20 vol % to 50 vol % and more preferably 30 vol % to 40 vol % of the conductive thermally conductive member.

Conductive Thermally Conductive Filler

In the conductive thermally conductive member, the binder resin contains a thermally conductive filler having conductivity (hereinafter also simply referred to as "thermally conductive filler"). The conductive thermally conductive filler is a component for improving the thermal conductivity and the electrical conductivity of the sheet.

Here, although the type of the thermally conductive filler is not limited, in terms of achieving higher thermal conductivity, fibrous thermally conductive filler is preferably used.

The term "fibrous" of the fibrous thermal conductive filler refers to a shape with a high aspect ratio (approximately 6 or more). Accordingly, in the present disclosure, the "fibrous thermal conductive filler" encompasses, for example, not only fibrous and bar-shaped thermal conductive fillers but also particulate fillers and flaky thermal conductive fillers that are high in aspect ratio.

Here, the kind of the fibrous thermally conductive filler is not limited as long as a fibrous, highly thermally conductive, and highly electrically conductive material is used; for example, a metal such as silver, copper, or aluminum, a ceramic such as alumina, aluminum nitride, silicon carbide, or graphite, or carbon fibers can be used.

Of such fibrous thermally conductive fillers, carbon fibers are more preferably used in terms of achieving higher thermal conductivity and electrical conductivity.

Note that one kind of the conductive thermally conductive filler may be used alone, or two or more kinds may be used as a mixture. Further, when two or more thermally conductive fillers are used, all of them may be fibrous thermally conductive fillers, or at least one fibrous thermally conductive filler may be used in combination with one or more thermally conductive fillers containing particles with a shape other than a fibrous shape.

The type of the carbon fibers is not limited, and may be selected as appropriate depending on the purpose. Examples include pitch-based carbon fibers, PAN-based carbon fibers, carbon fibers obtained by graphitizing PBO fibers, and carbon fibers synthesized by methods such as arc discharge, laser evaporation, chemical vapor deposition (CVD), or catalytic chemical vapor deposition (CCVD). Of these, carbon fibers obtained by graphitizing PBO fibers and pitch-based carbon fibers are more preferable, in terms of achieving high thermal conductivity and electrical conductivity.

Further, the carbon fibers may be partly or wholly subjected to surface treatment as necessary before use. Examples of the surface treatment include oxidation treatment, nitriding treatment, nitration, sulfonation, or treatments in which a metal, a metal compound, an organic compound, or the like is attached or coupled to a functional group introduced into the surfaces of the carbon fibers by any of these treatments or to the surfaces of the carbon fibers. Examples of the functional group include a hydroxyl group, a carboxyl group, a carbonyl group, a nitro group, and an amino group.

The average fiber length (average major axis length) of the fibrous thermally conductive filler is not limited, and may be selected as appropriate. In terms of ensuring high thermal conductivity, the average fiber length is preferably in a range of 50 μm to 300 μm, more preferably in a range of 75 μm to 275 μm, particularly preferably in a range of 90 μm to 250 μm.

The average fiber diameter (average minor axis length) of the fibrous thermally conductive filler is not limited, and may be selected as appropriate. In terms of ensuring high thermal conductivity, the average fiber diameter is preferably in a range of 4 μm to 20 μm, and more preferably in a range of 5 μm to 14 μm.

The aspect ratio (average major axis length/average minor axis length) of the fibrous thermally conductive filler used is 6 or more, and is preferably 7 to 30, in terms of ensuring high thermal conductivity. Even in the case where the aspect ratio is low, the thermal conductivity improving effect and the like are obtained. However, significant property improving effect is not achieved for example due to poor orientation in such a case. The aspect ratio is therefore set to 6 or more. If the aspect ratio is more than 30, the dispersibility in the conductive thermally conductive member is low, as a result of which sufficient thermal conductivity is unlikely to be achieved.

Here, the average major axis length and the average minor axis length of the fibrous thermally conductive filler can each be calculated by averaging the lengths in a plurality of samples measured using, for example, a microscope or a scanning electron microscope (SEM).

The content of the conductive thermally conductive filler in the conductive thermally conductive member is not limited, and may be determined as appropriate depending on the purpose. The content is preferably 4 vol % to 40 vol %, more preferably 5 vol % to 30 vol %, and particularly preferably 6 vol % to 20 vol %. If the content is less than 4 vol %, it would be difficult to obtain sufficiently low thermal resistance. If the content is more than 40 vol %, the formability of the conductive thermally conductive member and the orientation property of the fibrous thermally conductive filler would be affected.

In the conductive thermally conductive member, the conductive thermally conductive filler is preferably oriented in one or more directions. As a result of orienting the thermally conductive filler, higher thermal conductivity and electromagnetic wave absorption can be achieved.

For example, to increase the thermal conductivity and electrical conductivity of the conductive thermally conductive member and improve the heat dissipation of the semiconductor device according to the present disclosure, the thermally conductive filler may be oriented in a direction substantially perpendicular to the sheet surface. Meanwhile, for example when the flow of electricity in the conductive thermally conductive member is changed, the thermally conductive filler may be oriented in a direction substantially parallel to the sheet surface or other directions.

Herein, the direction substantially perpendicular to the sheet surface and the direction substantially parallel to the sheet surface refer to a direction approximately perpendicular to the sheet surface direction and a direction approximately parallel to the sheet surface direction, respectively. Since the orientation direction of the conductive thermally conductive filler varies to some extent in manufacture, a deviation of approximately ±20° from the direction perpendicular to the sheet surface direction or the direction parallel to the sheet surface direction is acceptable in the present disclosure.

The method of adjusting the orientation angle of the conductive thermally conductive filler is not limited. For example, the orientation angle can be adjusted by producing a compact for a sheet, from which the conductive thermally conductive member is to be formed, and adjusting the cutting angle in a state in which the fibrous thermally conductive filler is oriented.

Inorganic Filler

The conductive thermally conductive member may further contain an inorganic filler, in addition to the binder resin and conductive thermally conductive fibers described above. This further enhances the thermal conductivity of the conductive thermally conductive member and improves the strength of the sheet.

The shape, material, average particle diameter, etc. of the inorganic filler are not limited, and may be selected as appropriate depending on the purpose. Examples of the shape include spherical, ellipsoidal, bulk, particulate, flat, and needle-like shapes. Of these, a spherical or ellipsoidal shape is preferable in terms of filling property, and a spherical shape is particularly preferable.

Examples of the material of the inorganic filler include aluminum nitride (AlN), silica, alumina (aluminum oxide), boron nitride, titania, glass, zinc oxide, silicon carbide, silicon, silicon oxide, aluminum oxide, and metal particles. These may be used alone or in combination of two or more. Of these, alumina, boron nitride, aluminum nitride, zinc oxide, and silica are preferable. In terms of thermal conductivity, alumina and aluminum nitride are particularly preferable.

The inorganic filler used may have been subjected to surface treatment. By treating the inorganic filler with a coupling agent for the surface treatment, the dispersibility of the inorganic filler is improved, and the flexibility of the conductive thermally conductive member is improved.

The average particle diameter of the inorganic filler may be determined as appropriate, depending on the type of the inorganic material and the like.

In the case where the inorganic filler is alumina, its average particle diameter is preferably 1 μm to 10 μm, more preferably 1 μm to 5 μm, and particularly preferably 4 μm to 5 μm. If the average particle diameter is less than 1 μm, the viscosity is high, which may hinder mixing. On the other hand, if the average particle diameter is more than 10 μM the thermal resistance of the conductive thermally conductive member would increase.

In the case where the inorganic filler is aluminum nitride, its average particle diameter is preferably 0.3 μm to 6.0 μm, more preferably 0.3 μm to 2.0 μM and particularly preferably 0.5 μm to 1.5 μm. If the average particle diameter is less than 0.3 μm, the viscosity is high, which may hinder mixing. If the average particle diameter is more than 6.0 μm, the heat resistance of the conductive thermally conductive member would be high.

The average particle diameter of the inorganic filler can be found, for example, using a particle size distribution analyzer or a scanning electron microscope (SEM).

Magnetic Metal Powder

The conductive thermally conductive member preferably further contains a magnetic metal powder, in addition to the binder resin, fibrous thermally conductive filler, and inorganic filler. The inclusion of the magnetic metal powder increases the magnetic properties of the conductive thermally conductive member and improves the electromagnetic wave suppression effect of the semiconductor device.

The type of the magnetic metal powder is not limited as long as it increases the magnetic properties of the conductive thermally conductive member and improves the electromagnetic wave absorption, and a known magnetic metal powder may be selected as appropriate. For example, an amorphous metal powder or a crystalline metal powder may be used. Examples of the amorphous metal powder include Fe—Si—B—Cr-based, Fe—Si—B-based, Co—Si—B-based, Co—Zr-based, Co—Nb-based, and Co—Ta-based powders. Examples of the crystalline metal powder include pure iron, Fe-based, Co-based, Ni-based, Fe—Ni-based, Fe—Co-based, Fe—Al-based, Fe—Si-based, Fe—Si—Al-based, and Fe—Ni—Si—Al-based powders. As the crystalline metal powder, a microcrystalline metal powder obtained by adding a trace amount of N (nitrogen), C (carbon), O (oxygen), B (boron), or the like to a crystalline metal powder for refinement may be used.

For the magnetic metal powder, a mixture of two or more magnetic metal powders of different materials or different average particle diameters may be used.

The shape of the magnetic metal powder is preferably adjusted to be a spherical shape, a flat shape, or the like. For example, to obtain high filling property, a spherical magnetic metal powder having a particle diameter of several μm to several tens of μm is preferably used. Such a magnetic metal powder can be produced, for example, by atomization or a method of thermally decomposing metal carbonyl. The atomization has an advantage in that a spherical powder can be formed easily, and is a method of discharging molten metal from a nozzle and spraying a jet stream of air, water, inert gas, or the like to the discharged molten metal to solidify it as droplets, thus forming a powder. When producing an amorphous magnetic metal powder by atomization, the cooling rate is preferably set to approximately 1×106 (K/s), to prevent the molten metal from crystallization.

When an amorphous alloy powder is produced by atomization described above, the amorphous alloy powder particles have a smooth surface. When such an amorphous alloy powder with few surface irregularities and a small specific surface area is used as the magnetic metal powder, the filling property in the binder resin can be enhanced. The filling property can be further improved by performing coupling treatment.

The conductive thermally conductive member may optionally contain other components depending on the purpose, in addition to the binder resin, fibrous thermally conductive filler, inorganic filler, and magnetic metal powder described above.

Examples of the other components include thixotropic agents, dispersants, curing accelerators, retarders, tackifiers, plasticizers, flame retardants, antioxidants, stabilizers, and colorants.

<Method of Producing Semiconductor Device>

The method for producing the above-described semiconductor device according to the present disclosure is not limited.

For example, when the semiconductor device 1 of the embodiment as illustrated in FIG. 1 is produced, the method of producing the semiconductor device according to the present disclosure can use a method of production including a step of fixing by pressure a sheet-like conductive thermally conductive member 10 containing a cured resin onto the semiconductor element 30, thereby joining the semiconductor element 30 and the conductive thermally conductive member 10 and joining the conductive thermally conductive member 10 and the ground 60.

The above step makes it possible to ensure the upper end 20a of the conductive shield can 20 to bite into the conductive thermally conductive sheet 10 without performing complicated steps and to manufacture a semiconductor device providing excellent heat dissipation capacity and electromagnetic wave suppression effect.

In the method of producing a semiconductor device according to the present disclosure, steps other than the above-described step of fixing the conductive thermally conductive member 10 by pressure are not limited, and a known production method can be selected as appropriate.

EXAMPLES

More detailed description will be given below by way of examples, although the present disclosure is not limited to such examples.

Example 1

Figure 5A:
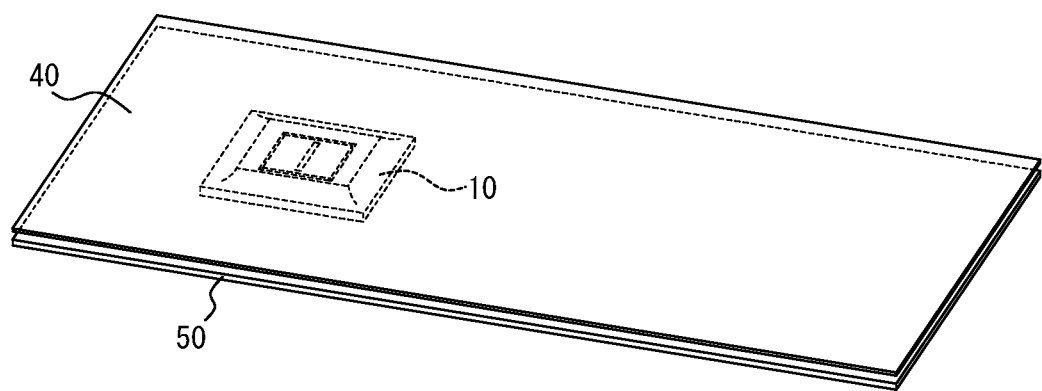
FIGS. 5A and 5B are diagrams illustrating a model for a semiconductor device used in analyses of the frequency response in Examples.
Figure 5B:
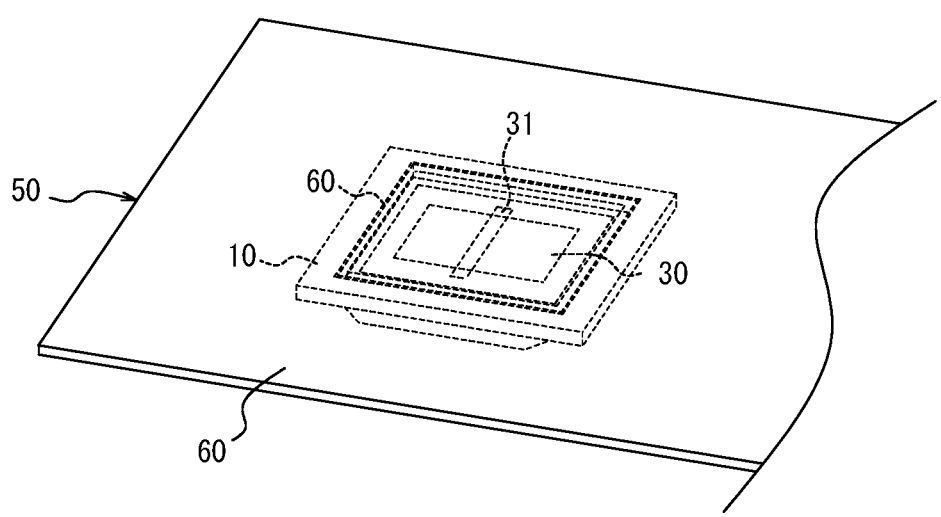

In Example 1, each analysis model of a semiconductor device (analysis models for Invention Example and Comparative Example) as illustrated in FIGS. 5A and 5B was prepared using a 3D electromagnetic field simulator ANSYS HFSS (manufactured by ANSYS, Inc.), and its electromagnetic wave suppression effect was evaluated.

For the conductive thermally conductive member 10 used in the models of a semiconductor device, two-part addition-reaction type liquid silicone was used as a resin binder, alumina (manufactured by Denka Company Limited) with an average particle diameter of 4 μm was used as a thermally conductive filler, and pitch-based carbon fibers ("thermally conductive fibers" manufactured by Nippon Graphite Fiber Corporation) with an average fiber length of 200 μm were used as a fibrous conductive thermally conductive filler, which were dispersed at a volume ratio (two-part addition-reaction type liquid silicone:alumina particles:pitch-based carbon fibers) of 35 vol %:53 vol %:12 vol % to prepare a silicone composition (composition for sheet). The resultant thermally conductive sheet had an average thermal conductivity in the vertical direction (the thermal resistance at the interface and the thermal resistance inside were calculated together) of 15 W/m·K as measured in accordance with ASTM D5470. Values obtained by S-parameter measurements were used for the magnetic properties and the dielectric properties of the sheet. The sheet exhibited a resistivity of 0.1 Ω·m as measured in accordance with JIS K7194. The size of the conductive thermally conductive member 10 was 22 mm×22 mm, and its thickness was 1 mm. For simulation models, the magnetic properties and dielectric properties of the above member were used, and analyses were made under conditions of resistivity: 0.15 Ω·m, 0.015 Ω·m, and 0.0015 Ω·m.

For the cooling member 40 (heatsink) used in the models of a semiconductor device, an aluminum plate was used as material, with a size of 30 mm×30 mm and a thickness of 0.3 mm.

(1) FIGS. 5A and 5B illustrate the analysis model of a semiconductor device according to Invention Example and are a top (upper side) view and a bottom (lower side) view, respectively. In FIGS. 5A and 5B, each member constituting the semiconductor device is illustrated in a perspective view to indicate the positional relationships between the members.

The sectional structure of the analysis model of Invention Example is the same as that in FIG. 1. The semiconductor element 30 was a microstripline (MSL) 31 covered with a resin mold, as illustrated in FIGS. 5A and 5B. The MSL 31 was obtained by providing a copper signal line (signal line size: 2 mm×1 mm×0.02 mm) on the front side of a dielectric substrate 50 (substrate size: 30 mm×30 mm×0.65 mm) and the ground 60 on the back side of the dielectric substrate 50. A signal source of the semiconductor element 30 was simplified using this MSL 31, with its ends being used as signal input and output ends. Further, the ground 60 part of which was exposed in the substrate was provided in the substrate (the size of the ground under the substrate: 30 mm×30 mm×0.02 mm, the size of the ground exposed in the substrate: inner size: 20 mm×20 mm, outer size: 22 mm×22 mm, thickness: 0.02 mm). The body (the part molded with the resin) of the semiconductor element 30 was a dielectric having a relative permittivity of 4 and a dielectric loss tangent of 0.01. The size of the body of the semiconductor element 30 was 16 mm×16 mm×0.7 mm.

(2) For Comparative Example, analysis models that were the same as the semiconductor devices of Invention Example described above except that the ground 60 was not provided on the substrate and that the conductive thermally conductive member 10 was not connected to the ground 60 were prepared as illustrated in FIG. 8A.

Figure 6A:
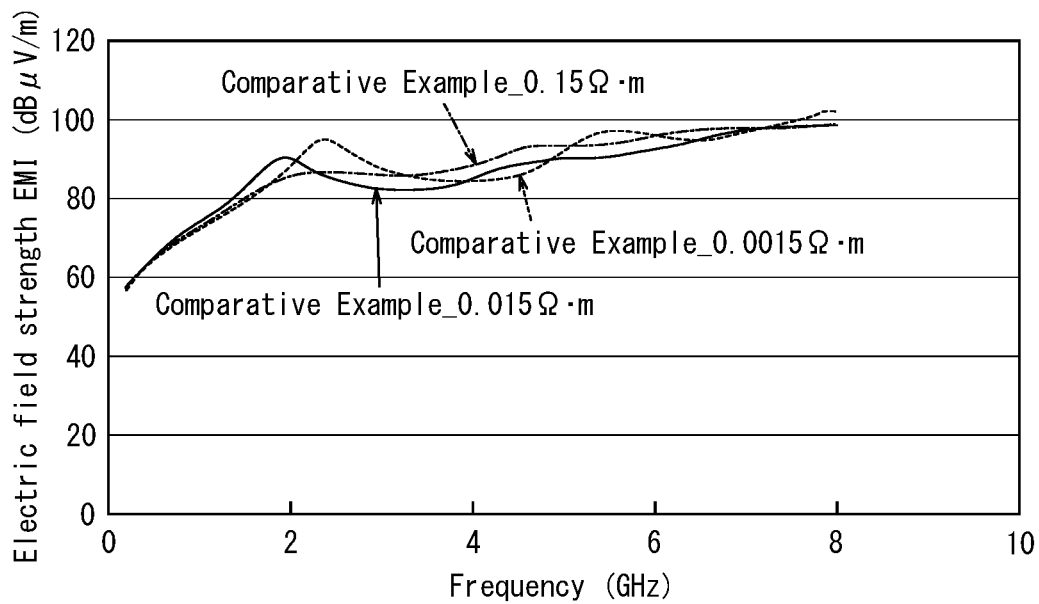
FIGS. 6A and 6B are graphs of the electric field strength depending on frequency in the case where the resistance value of each conductive thermally conductive member of a semiconductor device is changed in Invention Examples and Comparative Examples, respectively in Example 1.
Figure 6B:
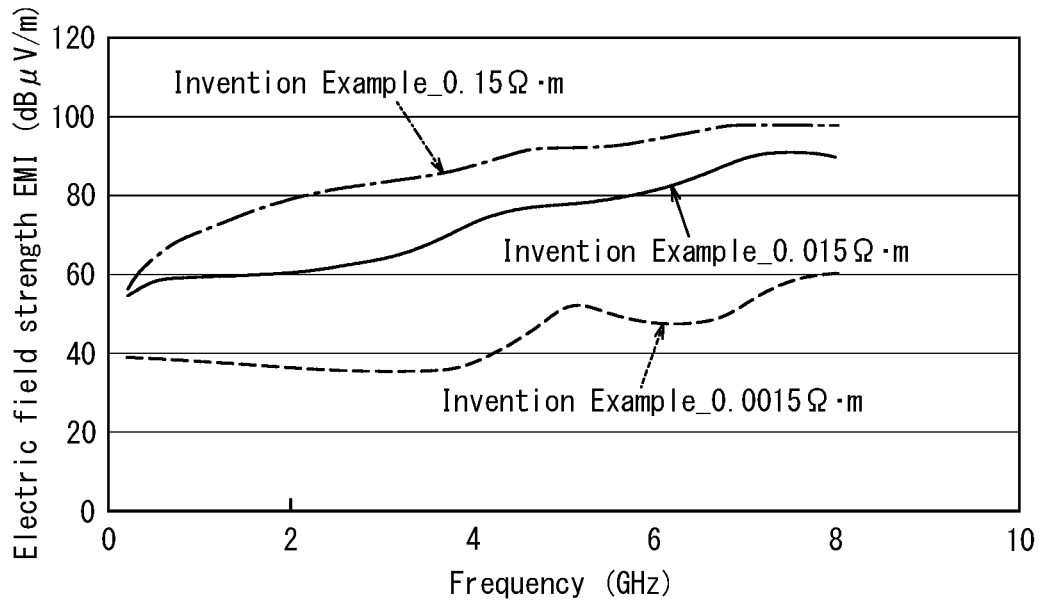

In the evaluation of the electromagnetic wave suppression effect, the maximum electric field strength at a position of 3 m away from the semiconductor device was calculated, and indicated as the electric field strength (dBμV/m) depending on frequency. FIGS. 6A and 6B illustrate the electric field strength calculation results.

FIGS. 6A and 6B illustrate the electric field strength calculation results for Invention Example and Comparative Example using conductive thermally conductive members 10 of 0.15 Ω·m, 0.015 Ω·m, and 0.0015 Ω·m.

From the results in FIGS. 6A and 6B, in the analysis models of Invention Example, generally good electromagnetic wave suppression effect (electric field strength reduction) was observed, as compared with the analysis models of Comparative Example.

Of the analysis models of Example, analysis models using the conductive thermally conductive members 10 having a lower resistivity of 0.015 Ω·m and 0.0015 Ω·m exhibited more excellent electromagnetic wave suppression effect.

Example 2

(1) In Example 2, each analysis model of a semiconductor device as illustrated in FIGS. 5A and 5B was prepared using the 3D electromagnetic field simulator under similar conditions to those for the semiconductor devices of Invention Example in Example 1, and its electromagnetic wave suppression effect was evaluated.

The resistivity of the conductive thermally conductive member 10 used in the model of a semiconductor device of Invention Example in Example 2 was 0.015 Ω·m.

(2) As the conductive thermally conductive members 10 used in a model of a semiconductor device of Invention Example in Example 2, a model was prepared under all the same conditions (size, thickness, thermal conductivity, and resistivity were all the same as those in Example 1) except that a magnetic powder (Fe—Si—B—Cr amorphous magnetic particles) was contained in the conductive thermally conductive members 10 to impart magnetic properties such that an imaginary part μr" of the relative permeability was 3.

(3) Further, as the conductive thermally conductive members 10 used in a model of a semiconductor device of Comparative Example of Example 2, a model was prepared under all the same conditions (size, thickness, thermal conductivity, and resistivity were all the same as those in Example 1) except that a magnetic powder (Fe—Si—B—Cr amorphous magnetic particles) was contained in the conductive thermally conductive members 10 to impart magnetic properties such that an imaginary part μr" of the relative permeability was 5.

In the evaluation of the electromagnetic wave suppression effect, the electric field strength (dBμV/m) depending on frequency was calculated as in Example 1. The calculation results are given in FIG. 7.

Figure 7:
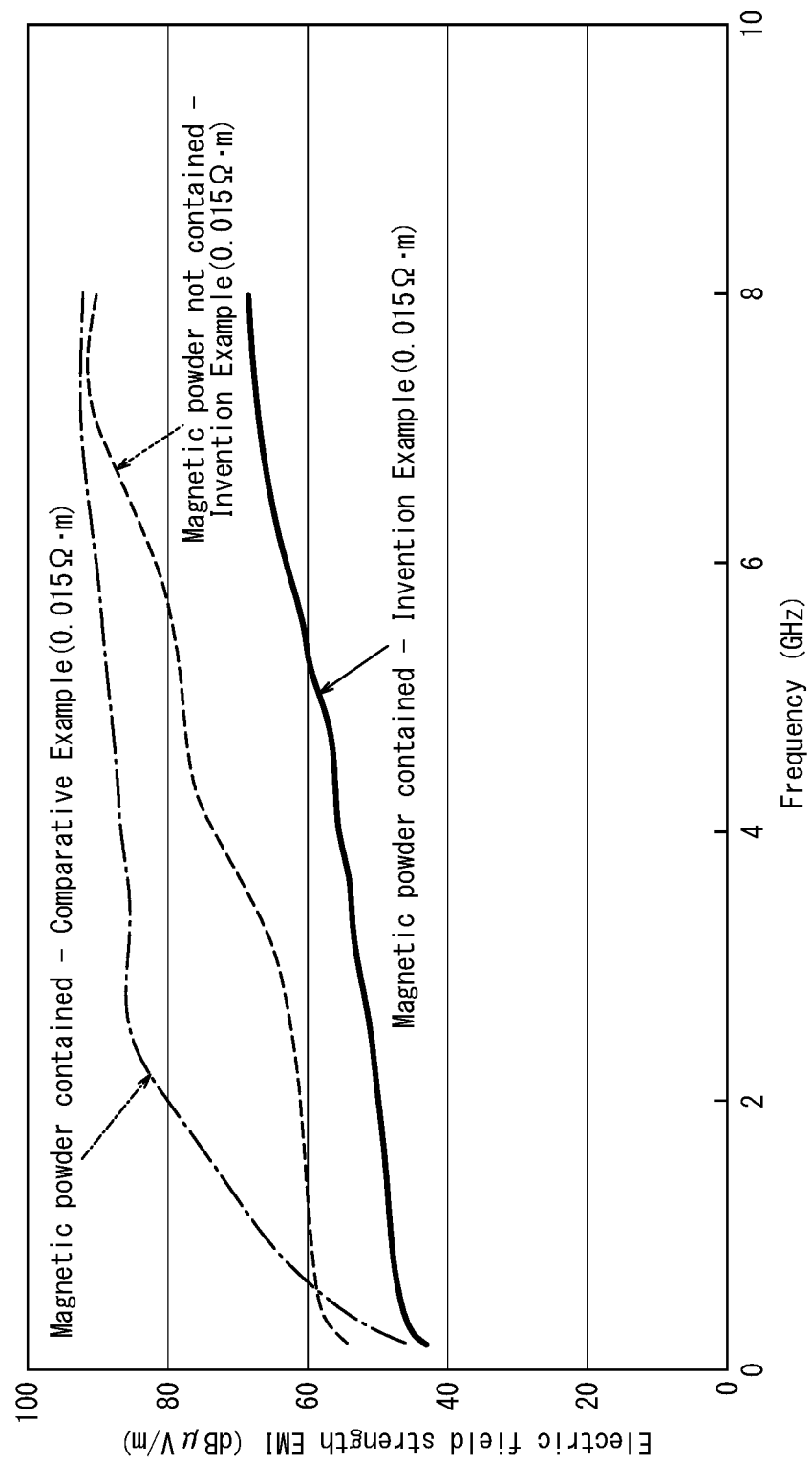
FIG. 7 is a graph of the electric field strength in accordance with the frequency in the case where the magnetic properties of a conductive thermally conductive member of a semiconductor device are changed in Example 2.

In FIG. 7, the electric field strengths obtained by the analysis models of a semiconductor device, having the conductive thermally conductive member 10 containing magnetic powder are represented as "magnetic powder contained—Invention Example (0.015 Ω·m)" and "magnetic powder contained—Comparative Example (0.015 Ω·m)"; and the electric field strength obtained by the analysis model of a semiconductor device, having the conductive thermally conductive member 10 containing magnetic powder is represented as "magnetic powder not contained—Invention Example (0.015 Ω·m)".

In the results in FIG. 7, for each model of Example and Comparative Example, more excellent electromagnetic wave suppression effect was observed when the conductive thermally conductive member 10 contained magnetic powder.

INDUSTRIAL APPLICABILITY

Thus, a semiconductor device that can be produced easily at low cost and has excellent heat dissipation capacity and electromagnetic wave suppression effect is provided.

REFERENCE SIGNS LIST 1 semiconductor device
10 conductive thermally conductive member
20 conductive shield can
30 semiconductor element
30a side surface of semiconductor element
30b upper surface of semiconductor element
31 MSL
40 cooling member
50 substrate
51 land
52 conductively-treated through hole
60 ground
100 conventional semiconductor device
A electrically closed space
T thickness of conductive thermally conductive member

The invention claimed is:

1. A semiconductor device comprising:
a semiconductor element provided on a substrate;
a conductive cooling member provided above the semiconductor element; and
a conductive thermally conductive member containing a cured resin, the conductive thermally conductive member being provided between the semiconductor element and the cooling member,
wherein the conductive thermally conductive member is connected to a ground in the substrate to electrically connect the cooling member and the ground, and
wherein the conductive thermally conductive member is provided to cover the semiconductor element and abuts at least part of an upper surface and at least part of a side surface of the semiconductor element.

2. The semiconductor device according to claim 1, wherein the conductive thermally conductive member seals the upper surface and the side surface of the semiconductor element.

3. The semiconductor device according to claim 1, wherein a resistivity of the conductive thermally conductive member is 0.15 Ω·m or less.

4. The semiconductor device according to claim 1, wherein a resistivity of the conductive thermally conductive sheet is 0.00001 Ω·m or more.

5. The semiconductor device according to claim 1, wherein the conductive thermally conductive member has magnetic properties.

6. The semiconductor device according to claim 1, wherein the conductive thermally conductive member has tackiness or adhesiveness at a surface thereof.

7. The semiconductor device according to claim 1, wherein the conductive thermally conductive member has flexibility.

8. The semiconductor device according to claim 1, wherein the conductive thermally conductive member contains a conductive filler.

9. The semiconductor device according to claim 8, wherein the conductive filler is carbon fiber.

10. The semiconductor device according to claim 1, part of the substrate other than the ground is insulated.

11. A method of producing the semiconductor device according to claim 1, the method comprising:
a step of fixing by pressure a sheet-like conductive thermally conductive member containing a cured resin onto a semiconductor element, thereby joining the semiconductor element and the conductive thermally conductive member and joining the conductive thermally conductive member and a ground, wherein the conductive thermally conductive member is provided to cover the semiconductor element and abuts at least part of an upper surface and at least part of a side surface of the semiconductor element.

* * * * *